(12) United States Patent
Ni et al.

(10) Patent No.: US 10,418,598 B1
(45) Date of Patent: Sep. 17, 2019

(54) OLED PANEL AND ITS METHOD OF MANUFACTURING, OLED DISPLAY

(71) Applicant: Wuhan China Star Optoelectronics Semiconductor Display Technology Co., Ltd., Wuhan (CN)

(72) Inventors: Jing Ni, Shenzhen (CN); Hsiang-lun Hsu, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/102,768

(22) Filed: Aug. 14, 2018

Related U.S. Application Data

(63) Continuation of application No. PCT/CN2018/087205, filed on May 17, 2018.

(30) Foreign Application Priority Data

Mar. 21, 2018 (CN) .......................... 2018 1 0234384

(51) Int. Cl.
*H01L 51/52* (2006.01)
*H01L 51/56* (2006.01)
*H01L 51/00* (2006.01)
*G09G 3/3208* (2016.01)

(52) U.S. Cl.
CPC .......... *H01L 51/56* (2013.01); *H01L 51/0005* (2013.01); *H01L 51/0008* (2013.01); *H01L 51/0097* (2013.01); *H01L 51/5256* (2013.01); *H01L 51/5275* (2013.01); *G09G 3/3208* (2013.01)

(58) Field of Classification Search
CPC ....................................................... H01L 27/30
See application file for complete search history.

(56) References Cited

U.S. PATENT DOCUMENTS

| 2015/0001483 A1* | 1/2015 | Namkung | ........... H01L 27/3244 257/40 |
| 2015/0137131 A1* | 5/2015 | Kim | .................... H01L 51/5256 257/72 |

FOREIGN PATENT DOCUMENTS

| CN | 106415873 A | 2/2017 |
| CN | 106684256 A | 5/2017 |
| CN | 106711347 A | 5/2017 |
| JP | 2007280901 A | 10/2007 |

* cited by examiner

*Primary Examiner* — Cheung Lee

(57) ABSTRACT

The present disclosure discloses an OLED panel and an OLED display. The OLED panel includes an OLED device and a thin film packaging structure formed on the OLED device. The thin film includes a first inorganic film layer, a first organic film layer, a second inorganic film layer, a third inorganic film layer and a fourth inorganic film layer set in sequence. The refractive index of the first inorganic film layer is greater than that of the first organic film layer, and the refractive index of the second inorganic film layer and the refractive index of the fourth inorganic film layer are both smaller than that of the third inorganic film layer. The light emitting efficiency of the OLED panel can be improved based on above structure of the OLED panel.

17 Claims, 2 Drawing Sheets

OLED PANEL AND ITS METHOD OF MANUFACTURING, OLED DISPLAY

CROSS-REFERENCE TO RELATED APPLICATIONS

This is a continuation-application of International Application No. PCT/CN2018/087205, with an international filing date of May 17, 2018, which claims foreign priority of Chinese Patent Application No. 201810234384.1, filed on Mar. 21, 2018 in the State Intellectual Property Office of China, the contents of all of which are hereby incorporated by reference.

TECHNICAL FIELD

The present disclosure relates to display technologies, and in particular to an OLED (Organic Light Emitting Diode) panel and its method of manufacturing, an OLED display.

BACKGROUND

An OLED display involves a flat panel display technology with great prospect. It has characteristics of self-illumination, simple structure, ultra-lightweight, fast response, wide viewing angle, low power consumption, flexible display and so on. Currently, the OLED display is favored by major display manufacturers and becomes a third-generation display following CRT (Cathode Ray Tube) display and LCD (Liquid Crystal Display).

Since the organic light emitting material used in the OLED panel is very sensitive to water and oxygen, the requirements for blocking water and oxygen are extremely strict. In general, a flexible film layer will be packaged on the organic light emitting material. The commonly used packaging structure is an inorganic or organic film layer. The inorganic film layer is usually dense, and its water-oxygen proof performance is good. However, during the deposition process, the stress of the film layer exists, which makes the inorganic film layer have poor bending properties and is prone to cracking and peeling. The fractured cracks are easily diffused in the inorganic film layer. The water-oxygen proof performance of the organic film layer is weak. However, it can effectively release the stress and avoid a further crack extension risk of the inorganic film layer. Therefore, at present, the OLED panel adopts a structure in which an inorganic film layer and an organic film layer overlap each other. The high water-oxygen proof capability of the inorganic film layer and the stress release of the organic film layer are complementary, and can be used to better meet the service life of the OLED panel.

The inventor of the present disclosure discovered in a long-term study that the current OLED panel uses a packaging structure of inorganic film layer-organic film layer-inorganic film layer, which has poor performance in blocking external water and oxygen, and the packaging structure of the OLED panel has a great influence on the light emitting efficiency of the OLED panel.

SUMMARY

The technical problem solved by the present disclosure is to provide an OLED panel and its method of manufacturing, an OLED display, which can increase the light emitting efficiency of the OLED panel while effectively blocking the external water and oxygen.

In order to solve the technical problem mentioned above, the present disclosure provides an method of manufacturing an OLED panel, including: preparing an OLED device including an organic light emitting layer; and forming a thin film packaging structure on the OLED device to cover the organic light emitting layer; wherein the forming the thin film packaging structure on the OLED device to cover the organic light emitting layer includes: forming a first inorganic film layer on the OLED device; forming a first organic film layer on a side of the first inorganic film layer far away from the OLED device; and a refractive index of the first inorganic film layer is greater than a refractive index of the first organic film layer; forming a second inorganic film layer on the first organic film layer; forming a third inorganic film layer on the second inorganic film layer; and forming a fourth inorganic film layer on the third inorganic film layer; and a refractive index of the second inorganic film layer and a refractive index of the fourth inorganic film layer are both smaller than a refractive index of the third inorganic film layer.

In order to solve the technical problem mentioned above, the present disclosure provides an OLED panel, including: an OLED device including an organic light emitting layer; a thin film packaging structure, formed on the OLED device and covering the organic light emitting layer; the thin film packaging structure includes a first inorganic film layer formed on the OLED device; a first organic film layer formed on a side of the first inorganic film layer far away from the OLED device; a second inorganic film layer formed on the first organic film layer; a third inorganic film layer formed on the second inorganic film layer; a fourth inorganic film layer formed on the third inorganic film layer; a refractive index of the first inorganic film layer is greater than a refractive index of the first organic film layer; a refractive index of the second inorganic film layer and a refractive index of the fourth inorganic film layer are both smaller than a refractive index of the third inorganic film layer.

In order to solve the technical problem mentioned above, the present disclosure provides an OLED display including an OLED display panel. The OLED display panel includes an OLED device including an organic light emitting layer; a thin film packaging structure, formed on the OLED device and covering the organic light emitting layer; the thin film packaging structure includes a first inorganic film layer formed on the OLED device; a first organic film layer formed on a side of the first inorganic film layer far away from the OLED device; a second inorganic film layer formed on the first organic film layer; a third inorganic film layer formed on the second inorganic film layer; a fourth inorganic film layer formed on the third inorganic film layer; a refractive index of the first inorganic film layer is greater than a refractive index of the first organic film layer; a refractive index of the second inorganic film layer and a refractive index of the fourth inorganic film layer are both smaller than a refractive index of the third inorganic film layer.

The benefit effects of the present disclosure are: different from the prior art, the OLED panel of the present disclosure including: an OLED device including an organic light emitting layer; a thin film packaging structure, formed on the OLED device and covering the organic light emitting layer, wherein the thin film packaging structure includes a first inorganic film layer, a first organic film layer, a second inorganic film layer, a third inorganic film layer and a fourth inorganic film layer set in sequence. The refractive index of the first inorganic film layer is greater than that of the first organic film layer, and the refractive index of the second inorganic film layer and the refractive index of the fourth inorganic film layer are both smaller than that of the third inorganic film layer. By setting the thin film packaging structure to include multiple inorganic film layers and matching the refractive index between the respective film layers, while ensuring the water and oxygen resistance of the OLED panel, the light emitting efficiency can be improved, and the loss of the light emitting efficiency caused by the thin film packaging structure can be reduced.

BRIEF DESCRIPTION OF THE DRAWINGS

In order to more clearly describe the technical solutions in the embodiments of the present disclosure, the drawings used in the description of the embodiments will be briefly described below. Obviously, the drawings in the following description are only some embodiments of the present disclosure. For those of ordinary skill in the art, other drawings may also be obtained based on these drawings without any creative work.

DETAILED DESCRIPTION

Figure 1:
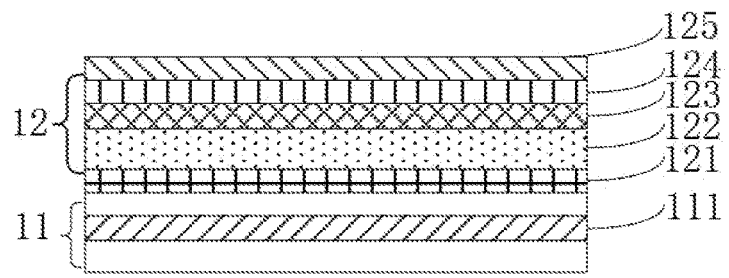
FIG. 1 is a schematic structural diagram of an embodiment of an OLED panel provided by the present disclosure.

The following will clearly and completely describe the technical solutions in the embodiments of the present disclosure with reference to the accompanying drawings in the embodiments of the present disclosure. It is to be understood that the specific embodiments described herein are only used to explain the present disclosure and are not intended to limit the present disclosure. It should also be noted that for ease of description, only some but not all of the structures related to the present disclosure are shown in the drawings. All other embodiments obtained by a person of ordinary skill in the art based on the embodiments of the present disclosure without making creative efforts shall fall within the protection scope of the present disclosure.

Referring to FIG. 1, FIG. 1 is a schematic structural diagram of an embodiment of an OLED panel provided by the present disclosure. The OLED panel includes an OLED device 11 and a thin film packaging structure 12.

The OLED device 11 includes an organic light emitting layer 111. Optionally, the organic light emitting layer 111 includes a red sub-pixel, a green sub-pixel, and a blue sub-pixel.

It can be understood that the OLED device 11 may further include a substrate, an anode layer, a hole injection layer, a hole transport layer, an electron transport layer, an electron injection layer, a cathode layer, and other layers well known to those skilled in the art. We will not repeat here.

The thin film packaging structure 12 is formed on the OLED device 11 and covers the organic light emitting layer 111. The thin film packaging structure 12 includes a first inorganic film layer 121, a first organic film layer 122, a second inorganic film layer 123, a third inorganic film layer 124, and a fourth inorganic film layer 125.

Specifically, the first inorganic film layer 121 is formed on the OLED device 11. The first organic film layer 122 is formed on a side of the first inorganic film layer 121 far away from the OLED device 11. The second inorganic film layer 123 is formed on the first organic film layer 122. The third inorganic film layer 124 is formed on the second inorganic film layer 123, and the fourth inorganic film layer 125 is formed on the third inorganic film layer 124, that is, the first inorganic film layer 121, the first organic film layer 122, the second inorganic film layer 123, the third inorganic film layer 124 and the fourth inorganic film layer 125 are sequentially disposed.

Compared with the thin film packaging structure in the prior art only including the inorganic film layer, the organic film layer and the inorganic film layer, the thin film packaging structure in the present embodiment includes four inorganic film layers, which can improve the water and oxygen resistance of the OLED panel.

Meanwhile, in the present embodiment, the refractive index of the first inorganic film layer 121 is greater than that of the first organic film layer 122, and the refractive index of the second inorganic film layer 123 and the refractive index of the fourth inorganic film layer 125 are both smaller than that of the third inorganic film layer 124.

Specifically, light will pass through the first inorganic film layer 121, the first organic film layer 122, the second inorganic film layer 123, the third inorganic film layer 124, and the fourth inorganic film layer 125 in sequence. When the light passes through the first inorganic film layer 121 and enters the first organic film layer 122 with a lower refractive index, the first organic film layer 122 plays expansion effect on light. Further, the light continues to be expanded after entering the second inorganic film layer 123, and the second inorganic film layer 123 can cover more light paths. Then the light that has been expanded enters the third inorganic film layer 124 with a relatively high refractive index. Because the refractive index of the third inorganic film layer 124 is greater than that of the fourth inorganic film layer 125, some light may be reflected. The reflected light is continuously reflected and amplified by the second inorganic film layer 123 and the first inorganic film layer 121, generating a resonance effect, thereby improving light emitting efficiency.

In the OLED panel of the above embodiment, by setting a multilayer inorganic film layer and matching the refractive index between the respective film layers, while ensuring the water and oxygen resistance of the OLED panel, the light output rate can be improved, and the loss of the light emitting efficiency caused by the film packaging structure can be reduced.

Optionally, in one application scene, the difference between the refractive index of the first inorganic film layer 121 and the refractive index of the first organic film layer 122 is 0.1-0.3, that is, the refractive index of the first inorganic film layer 121 is greater than the refractive index of the first organic film layer 122, the difference range is 0.1-0.3.

Optionally, in one application scene, the first inorganic film layer 121 has a refractive index of 1.8-2.3, the first organic film layer 122 has a refractive index of 1.6-2.0, the second inorganic film layer 123 has a refractive index of 1.4-1.7, the third inorganic film layer 124 has a refractive index of 1.8-2.3, and the fourth inorganic film layer 125 has a refractive index of 1.4-1.7. Therefore, the light emitting efficiency of the OLED device is improved by setting a certain refractive index of each film layer.

Optionally, in one application scene, the first inorganic film layer 121 has a thickness of 100-300 nm, the first organic film layer 122 has a thickness of 3000-8000 nm, the second inorganic film layer 123 has a thickness of 50-1000 nm, the third inorganic film layer 124 has a thickness of 10-300 nm, and the fourth inorganic film layer 125 has a thickness of 50-1000 nm. Therefore, the light emitting efficiency of the OLED device is improved by setting a certain thickness of each film layer, when ensuring that the thin film packaging structure 12 has the minimum thickness.

Optionally, in one application scene, the material of the first inorganic film layer 121 and the material of the third inorganic film layer 124 are the same or different, and each of the material of the first inorganic film layer 121 and the material of the third inorganic film layer 124 is at least one of titanium dioxide, silicon nitride, silicon oxide and zirconium oxide. That is, the refractive index of the first inorganic film layer 121 and the refractive index of the third inorganic film layer 124 are controlled by choosing material of the first inorganic film layer 121 and material of the third inorganic film layer 124.

Optionally, in one application scene, the material of the second inorganic film layer 123 and the material of the fourth inorganic film layer 125 are the same or different, and each of the material of the second inorganic film layer 123 and the material of the fourth inorganic film layer 125 is at least one of silicon oxynitride and aluminum oxide, that is, the refractive index of the second inorganic film layer 123 and the refractive index of the fourth inorganic film layer 125 are controlled by choosing the material of the second inorganic film layer 123 and the material of the fourth inorganic film layer 125.

Optionally, in an application scene, the first inorganic film layer 121, the second inorganic film layer 123, the third inorganic film layer 124 and the fourth inorganic film layer 125 are prepared by plasma enhanced chemical vapor deposition (PECVD), pulsed laser deposition (PLD), or sputtering (Sputter).

Optionally, in one application scenario, the first organic film layer 122 is prepared by plasma enhanced chemical vapor deposition (PECVD), inkjet printing (IJP), or coating.

Figure 2:
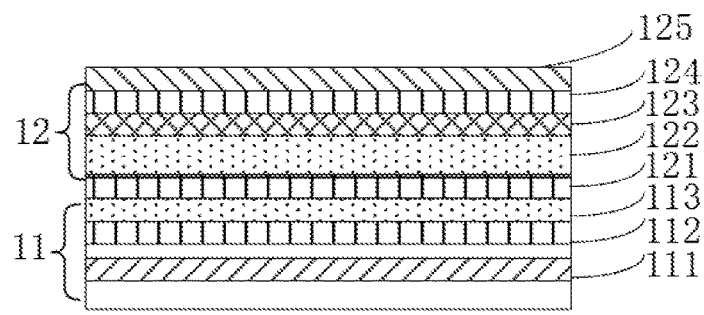
FIG. 2 is a schematic structural diagram of another embodiment of an OLED panel provided by the present disclosure.

Referring to FIG. 2, FIG. 2 is a schematic structural diagram of another embodiment of an OLED panel provided by the present disclosure. Different from the embodiment of FIG. 1, in the present embodiment, the OLED device 11 further includes: a cover layer 112 and a lithium fluoride layer 113.

The cover layer 112 is formed on the organic light emitting layer 111, the lithium fluoride layer 113 is formed on the cover layer 112, and the first inorganic film layer 121 is formed on the lithium fluoride layer 113.

Optionally, the cover layer 112 is made of an organic material. When the thin film package structure 12 is formed on the OLED device 11, it is possible to generate dark spots on the OLED device 11. Therefore, the OLED device 11 can be protected by setting the OLED device 11 to include the cover layer 112 and the lithium fluoride layer 113.

Figure 3:
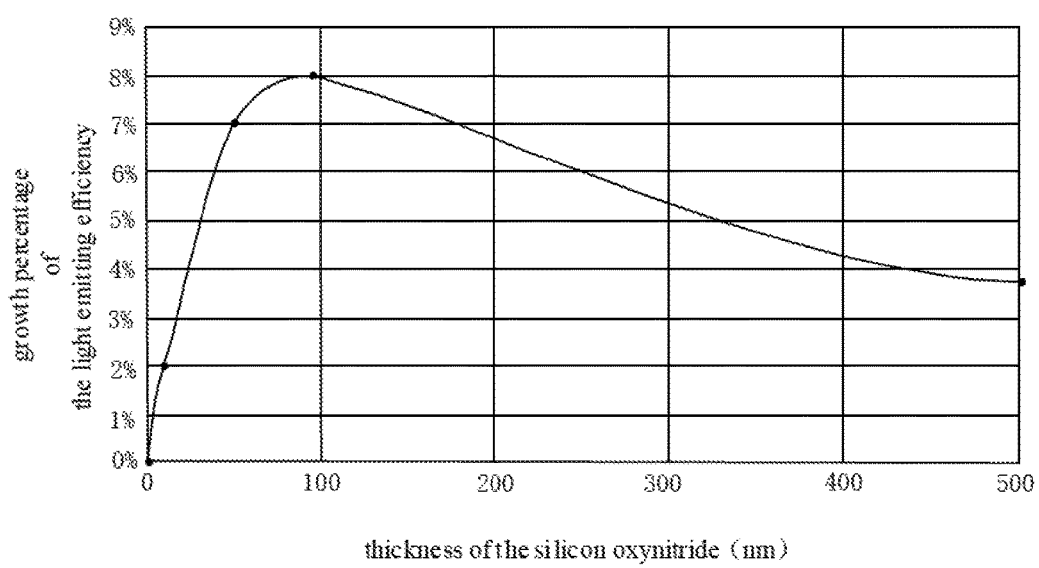
FIG. 3 is a curve graph verifying a light emitting efficiency of an OLED panel provided by the present disclosure using optical simulation software.

Referring to FIG. 3, FIG. 3 is a curve graph verifying a light emitting efficiency of an OLED panel provided by the present disclosure using optical simulation software.

In the simulation test, the materials of the first inorganic film layer 121 and the third inorganic film layer 124 are set to silicon nitride, and the thicknesses of the first inorganic film layer 121 and the third inorganic film layer 124 are both set to 200 nm, while the materials of the second inorganic film layer 123 and the fourth inorganic film layer 125 are set to silicon oxynitride, and the thicknesses of the second inorganic film layer 123 and the fourth inorganic film layer 125 are set to be the same. FIG. 3 shows growth curve of the light emitting efficiency of the OLED panel in this disclosure relative to which of the OLED panel (the thin film packaging structure only includes: inorganic film layer-organic film-inorganic film layer) in the prior art, with the thickness increase of the silicon oxynitride (the second inorganic film layer 123 and the fourth inorganic film layer 125). As shown in FIG. 3, the OLED panel in the present disclosure can significantly improve light emitting efficiency.

Figure 4:
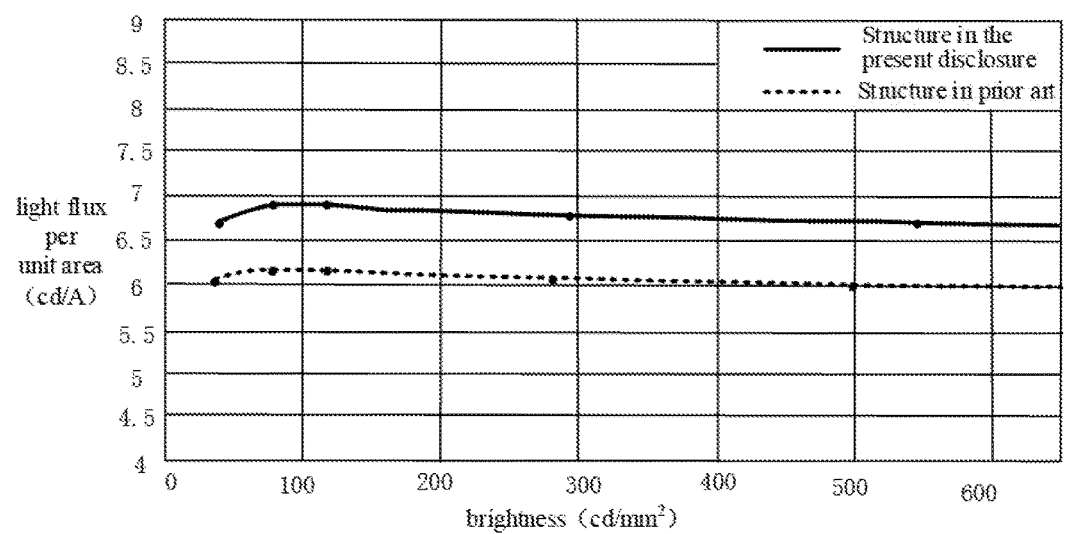
FIG. 4 is a curve graph of a light emitting efficiency of an OLED panel provided by the present disclosure in a practical experiment.

Referring to FIG. 4. FIG. 4 is a curve graph of a light emitting efficiency of an OLED panel provided by the present disclosure in a practical experiment.

In this experiment, the materials of the first inorganic film layer 121 and the third inorganic film layer 124 are set to silicon nitride, and the materials of the second inorganic film layer 123 and the fourth inorganic film layer 125 are set to silicon oxynitride, and the thicknesses of the second inorganic film layer 123, the third inorganic film layer 124 and the fourth inorganic film layer 125 are set to 300 nm, the thickness of the first organic film layer 122 is set to 6000 nm, and experimental data results are shown in FIG. 4, when the thickness of the first inorganic film layer 121 is 900 nm and the brightness is 500 cd/mm$^2$, the current efficiency of the OLED panel in the present disclosure is higher by about 11% (In the prior art the light flux per unit area of the OLED panel is 6 Cd/A, In the present disclosure, the light flux per unit area of the OLED panel is 6.7 Cd/A), thereby verifying that the OLED panel in the present disclosure can effectively improve the light emitting efficiency of the OLED panel.

Figure 5:
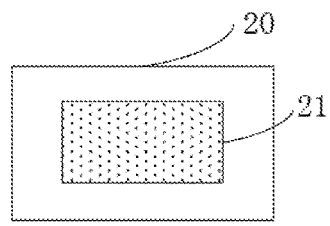
FIG. 5 is a schematic structural diagram of an embodiment of an OLED display provided by the present disclosure.

Referring to FIG. 5, FIG. 5 is a schematic structural diagram of an embodiment of an OLED display provided by the present disclosure. The OLED display 20 includes the OLED panel 21 in any of the above embodiments. For a specific OLED panel 21, reference may be made to the above embodiment, and it is no longer repeated here.

In summary, different from the prior art, by setting the thin film packaging structure to include multiple inorganic film layers and matching the refractive index and the thickness between the respective film layers, while ensuring the water and oxygen resistance of the OLED panel, the light emitting efficiency can be improved.

The foregoing descriptions are merely implementation manners of the present disclosure, and therefore do not limit the scope of patents of the present disclosure. Any equivalent structure or equivalent process transformation using the description of the present disclosure and the accompanying drawings may be directly or indirectly applied to other related technologies. The same applies in the field of patent protection of this disclosure.

What is claimed is:

1. A method of manufacturing an organic light emitting diode (OLED) panel, comprising:
   preparing an OLED device comprising an organic light emitting layer; and
   forming a thin film packaging structure on the OLED device to cover the organic light emitting layer;
   wherein
   the forming the thin film packaging structure on the OLED device to cover the organic light emitting layer comprises:
   forming a first inorganic film layer on the OLED device;
   forming a first organic film layer on a side of the first inorganic film layer far away from the OLED device;

and a refractive index of the first inorganic film layer is greater than a refractive index of the first organic film layer;

forming a second inorganic film layer on the first organic film layer;

forming a third inorganic film layer on the second inorganic film layer; and forming a fourth inorganic film layer on the third inorganic film layer; and a refractive index of the second inorganic film layer and a refractive index of the fourth inorganic film layer are both smaller than a refractive index of the third inorganic film layer, a difference between the refractive index of the first inorganic film layer and the refractive index of the first organic film layer is 0.1-0.3.

2. The method of manufacturing according to claim 1, wherein
the forming the first inorganic film layer comprises: forming the first inorganic film layer by plasma enhanced chemical vapor deposition, pulsed laser deposition, or sputtering;
the forming the second inorganic film layer comprises: forming the second inorganic film layer by plasma enhanced chemical vapor deposition, pulsed laser deposition, or sputtering;
the forming the third inorganic film layer comprises: forming the third inorganic film layer by plasma enhanced chemical vapor deposition, pulsed laser deposition, or sputtering;
the forming the fourth inorganic film layer comprises: forming the fourth inorganic film layer by plasma enhanced chemical vapor deposition, pulsed laser deposition, or sputtering.

3. The method of manufacturing according to claim 1, wherein
the forming the first organic film layer comprises: forming the first organic film layer by plasma enhanced chemical vapor deposition, ink jet printing, or coating.

4. The method of manufacturing according to claim 1, wherein the preparing an OLED device comprises:
preparing the organic light emitting layer;
forming a cover layer on the organic light emitting layer;
forming a lithium fluoride layer on the cover layer;
the forming the first inorganic film layer on the OLED device comprises:
forming the first inorganic film layer on the lithium fluoride layer.

5. An OLED panel, comprising:
an OLED device, comprising an organic light emitting layer; and
a thin film packaging structure, formed on the OLED device and covering the organic light emitting layer, wherein:
the thin film packaging structure comprises:
a first inorganic film layer formed on the OLED device;
a first organic film layer formed on a side of the first inorganic film layer far away from the OLED device;
a second inorganic film layer formed on the first organic film layer;
a third inorganic film layer formed on the second inorganic film layer; and
a fourth inorganic film layer formed on the third inorganic film layer;
wherein, a refractive index of the first inorganic film layer is greater than a refractive index of the first organic film layer; and
a refractive index of the second inorganic film layer and a refractive index of the fourth inorganic film layer are both smaller than a refractive index of the third inorganic film layer, a difference between the refractive index of the first inorganic film layer and the refractive index of the first organic film layer is 0.1-0.3.

6. The OLED panel according to claim 5, wherein the first inorganic film layer has a refractive index of 1.8-2.3, the first organic film layer has a refractive index of 1.6-2.0, the second inorganic film layer has a refractive index of 1.4-1.7, the third inorganic film layer has a refractive index of 1.8-2.3, and the fourth inorganic film layer has a refractive index of 1.4-1.7.

7. The OLED panel according to claim 5, wherein the first inorganic film layer has a thickness of 100-300 nm, the first organic film layer has a thickness of 3000-8000 nm, the second inorganic film layer has a thickness of 50-1000 nm, the third inorganic film layer has a thickness of 10-300 nm, and the fourth inorganic film layer has a thickness of 50-1000 nm.

8. The OLED panel according to claim 5, wherein a material of the first inorganic film layer and a material of the third inorganic film layer are the same or different; and
each of the material of the first inorganic film layer and the material of the third inorganic film layer is at least one of titanium dioxide, silicon nitride, silicon oxide, and zirconium oxide.

9. The OLED panel according to claim 5, wherein a material of the second inorganic film layer and a material of the fourth inorganic film layer are the same or different; and
each of the material of the second inorganic film layer and the material of the fourth inorganic film layer is at least one of silicon oxynitride and aluminum oxide.

10. The OLED panel according to claim 5, wherein the first inorganic film layer, the second inorganic film layer, the third inorganic film layer and the fourth inorganic film layer are prepared by plasma enhanced chemical vapor deposition, pulsed laser deposition, or sputtering.

11. The OLED panel according to claim 5, wherein the first organic film layer is prepared by plasma enhanced chemical vapor deposition, ink jet printing, or coating.

12. The OLED panel according to claim 5, wherein the OLED device further comprises:
a cover layer formed on the organic light emitting layer; and
a lithium fluoride layer formed on the cover layer;
wherein the first inorganic film layer is formed on the lithium fluoride layer.

13. An OLED display, comprising an OLED panel, the OLED panel comprising:
an OLED device, comprising an organic light emitting layer; and
a thin film packaging structure, formed on the OLED device and covering the organic light emitting layer, wherein:
the thin film packaging structure comprises:
a first inorganic film layer formed on the OLED device;
a first organic film layer formed on a side of the first inorganic film layer far away from the OLED device;
a second inorganic film layer formed on the first organic film layer;
a third inorganic film layer formed on the second inorganic film layer; and
a fourth inorganic film layer formed on the third inorganic film layer;

wherein, a refractive index of the first inorganic film layer is greater than a refractive index of the first organic film layer; and a refractive index of the second inorganic film layer and a refractive index of the fourth inorganic film layer are both smaller than a refractive index of the third inorganic film layer, wherein a difference between the refractive index of the first inorganic film layer and the refractive index of the first organic film layer is 0.1-0.3.

14. The OLED display according to claim 13, wherein the first inorganic film layer has a refractive index of 1.8-2.3, the first organic film layer has a refractive index of 1.6-2.0, the second inorganic film layer has a refractive index of 1.4-1.7, the third inorganic film layer has a refractive index of 1.8-2.3, and the fourth inorganic film layer has a refractive index of 1.4-1.7.

15. The OLED display according to claim 13, wherein the first inorganic film layer has a thickness of 100-300 nm, the first organic film layer has a thickness of 3000-8000 nm, the second inorganic film layer has a thickness of 50-1000 nm, the third inorganic film layer has a thickness of 10-300 nm, and the fourth inorganic film layer has a thickness of 50-1000 nm.

16. The OLED display according to claim 13, wherein a material of the first inorganic film layer and a material of the third inorganic film layer are the same or different; and each of the material of the first inorganic film layer and the material of the third inorganic film layer is at least one of titanium dioxide, silicon nitride, silicon oxide, and zirconium oxide.

17. The OLED display according to claim 13, wherein a material of the second inorganic film layer and a material of the fourth inorganic film layer are the same or different; and each of the material of the second inorganic film layer and the material of the fourth inorganic film layer is at least one of silicon oxynitride and aluminum oxide.

* * * * *